United States Patent [19]
AuYeung et al.

[11] Patent Number: 5,604,758
[45] Date of Patent: Feb. 18, 1997

[54] MICROPROCESSOR CONTROLLED THERMOELECTRIC COOLER AND LASER POWER CONTROLLER

[75] Inventors: Vincent AuYeung, Temple City; Kristine Cam, Stanton; Tiffany G. To, El Monte, all of Calif.

[73] Assignee: Xerox Corporation, Stamford, Conn.

[21] Appl. No.: 524,660

[22] Filed: Sep. 8, 1995

[51] Int. Cl.$^6$ .................................................. H01S 3/04
[52] U.S. Cl. .................................................. 372/34; 372/38
[58] Field of Search .................................................. 372/34, 38

[56] References Cited

U.S. PATENT DOCUMENTS

| | | | |
|---|---|---|---|
| 5,118,964 | 6/1992 | McArdoe | 372/34 |
| 5,287,367 | 2/1994 | Yanagawa | 372/34 |
| 5,438,579 | 8/1995 | Eda et al. | 372/34 |

*Primary Examiner*—Leon Scott, Jr.
*Attorney, Agent, or Firm*—Nola Mae McBain

[57] ABSTRACT

A microprocessor controlled electronic subsystem for monitoring either a thermoelectric cooler or a laser diode and adjusting the thermoelectric cooler to compensate for temperature effects. The microprocessor, with the aid of a temperature sensor, monitors the current temperature of the thermoelectric cooler or laser diode and then chooses an appropriate target value to minimize the amount of time needed to drive the thermoelectric cooler or the laser to the appropriate temperature. The microprocessor contains software whose purpose is to choose the appropriate target value in order to fine tune the control response of the entire system. The system also includes the ability to pick a new target value if the environment or ambient temperature is beyond designed for values.

8 Claims, 3 Drawing Sheets

MICROPROCESSOR CONTROLLED THERMOELECTRIC COOLER AND LASER POWER CONTROLLER

BACKGROUND

This invention relates generally to thermo electric coolers and temperature sensors and more particularly concerns a circuit for a thermoelectric cooler and a temperature sensor which is able to monitor and provide accurate temperature control of the thermoelectric cooler.

A single beam laser diode assembly has a single diode and usually, in a scanning system, the diode is driven by a train of image pixel information. The pixel information is used to drive the diode and therefore stimulate laser flux emission where there is a white pixel in a write white system. In a write white system, a laser is turned on to create white space on a page. Intensity of the light beam is directly proportional to the output power of the laser. In order to keep the output power of the diode constant, the temperature of the diode should be kept at a constant level. However, due to the structure of the laser diode assembly, as the pixel information changes, which causes the diode to turn on and off, the temperature of the diode fluctuates, which in turn causes the output power of the diode and the intensity of the light beam to fluctuate. In a printing, system fluctuation in the intensity of light beams causes fluctuation in the exposure of a printed pixel.

A multiple beam diode assembly has at least two diodes in close proximity on a common substrate. Each diode is driven by a separate train of image pixel information. Again, as the pixel information changes, the temperature of each diode fluctuates. However, in a multiple diode system, the changing temperature of a diode also causes a temperature fluctuation in adjacent diodes. The temperature fluctuations of the adjacent diodes cause the output power and the intensity of the light beams in those adjacent diodes also to fluctuate.

A tri-level system may use one or more diodes with at least one diode operating at full on, full off, and partially on. One example of an application using a single diode tri-level system is the printing of black and white documents with a highlight color. Tri-level systems suffer from the same heating effects both in the full on and the partially on modes of the laser.

Accordingly, it is the primary aim of the invention to provide a method for quickly compensating for a variety of thermally induced effects. Further advantages of the invention will become apparent as the following description proceeds.

SUMMARY OF THE INVENTION

Briefly stated and in accordance with the present invention, there is provided a microprocessor controlled electronic subsystem for monitoring either a thermoelectric cooler or a laser diode and adjusting the thermoelectric cooler to compensate for temperature effects.

Figure 1:
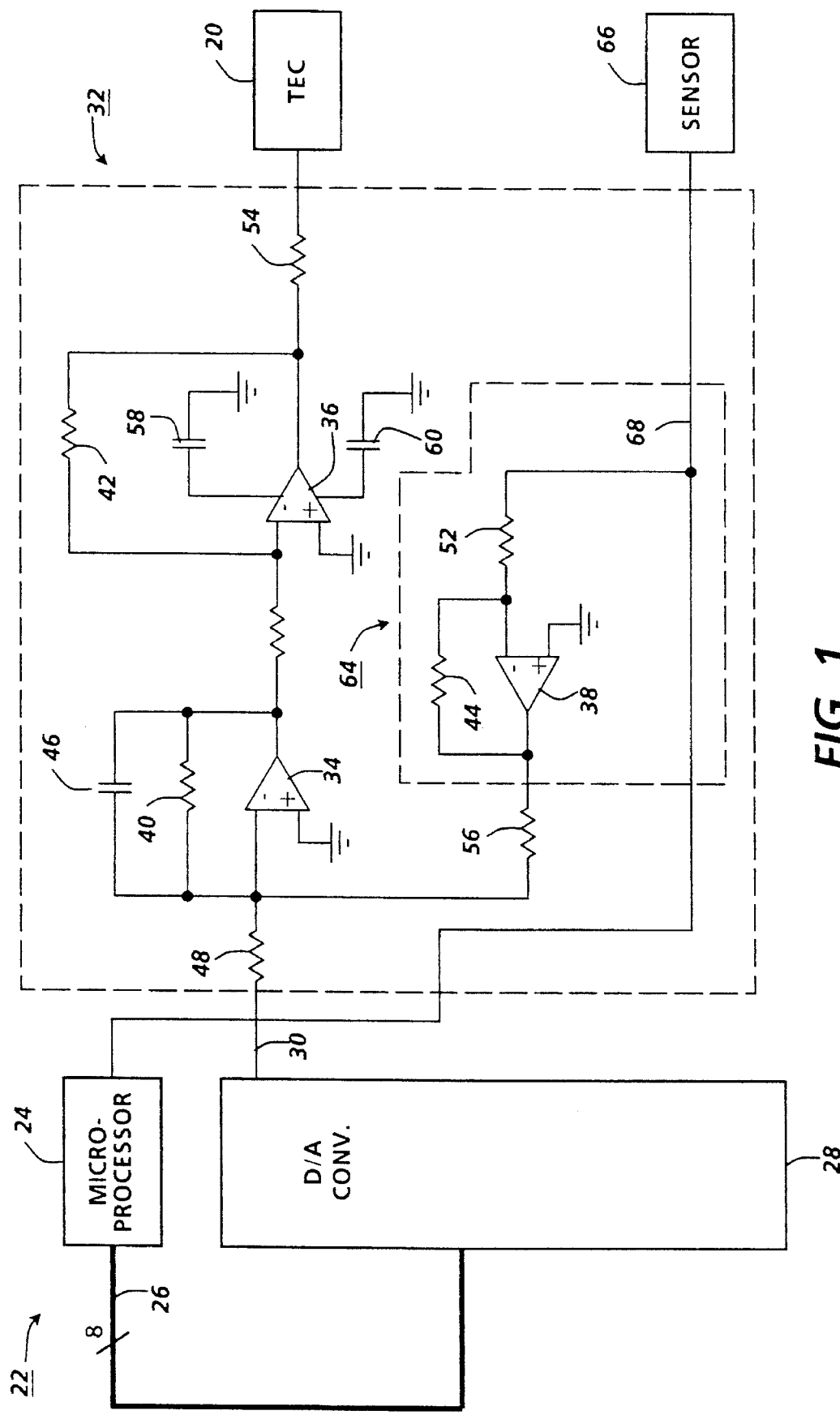
FIG. 1 is a circuit diagram of a linear servo controlled electronic circuit to monitor and correct for problems of laser drift.

While the present invention will be described in connection with a preferred embodiment and method of use, it will be understood that it is not intended to limit the invention to that embodiment/procedure. On the contrary, it is intended to cover all alternatives, modifications and equivalents as may be included within the spirit and scope of the invention as defined by the appended claims.

ALPHA-NUMERIC LIST OF ELEMENTS curve C1
curve C2
range R
initital temperature value T0
temperature value T1
temperature value T2
target temperature value T3
thermoelectric cooler 20
stabilizing circuit 22
microprocessor 24
8-bit bus 26
analog converter 28
line 30
thermelectric cooler circuit 32
time constant operational amplifier 34
power operational amplifier 36
time constant operational amplifier 38
resistor 40
resistor 42
resistor 44
capacitor 46
resistor 48
resistor 50
resistor 52
resistor 54
resistor 56
capacitor 58
capacitor 60
line 62
feedback circuit 64
thermoelectric cooler sensor 66
line 68
thermoelectric cooler 70
stabilizing circuit 72
microprocessor 74
line 76
buffer 78
line 80
switch 82
line 84
sensor 86
line 88

DETAILED DESCRIPTION OF THE INVENTION

Turning now to FIG. 1 a circuit diagram of an electronic circuit to monitor and correct for problems of laser drift by monitoring temperature of a thermoelectric cooler is shown. A thermoelectric cooler 20 is used to stabilize the temperature of a laser diode (not shown). In order to more accurately stabilize the temperature the thermoelectric cooler 20 must be monitored and adjusted. A stabilizing circuit 22 is used to perform this funtion. A microprocessor 24 outputs a digital target value on 8-bit bus 26. The target value is then received by a digital to analog converter 28. After conversion to an analog signal the target value is passed to a thermoelectric cooler circuit 32 on line 30.

The thermoelectric cooler circuit 32 has 3 operational amplifiers. Two of the operational amplifiers 34, 38 are used in the configuration to provide forward and feedback time constants, respectively, to the thermoelectric cooler circuit 32. The third, power operational amplifier 36 is used to provide the correct power output to the thermoelectric cooler 20. The three operational amplifiers 34, 36, 38 are all configured to work in inverting mode. Each operational amplifier 34, 36, 38 is also connected in parallel with a resistor 40, 42, 44 respectively. Additionally, operational amplifier 34 is also connected in parallel with a capacitor 46. Each of the three operational amplifiers 34, 36, 38 also has a resistor 48, 50, 52 respectively connected at its input. Each of the three operational amplifiers 34, 36, 38 also has a resistor 50, 54, 56 respectively connected at its output. The elements for the thermoelectric cooler circuit 32 are completed by including two capacitors 58, 60 connected to operational amplifier 58. Capacitors 58, 60 provide power supply filtering functions to the power operational amplifier 36.

The capacitor 46 and resistors 40, 48 provide the forward time constant function for the thermoelectric cooler circuit 32. The capacitor 46 and resistors 40, 56 provide the feedback time constant for the thermoelectric circuit 32.

Figure 2:
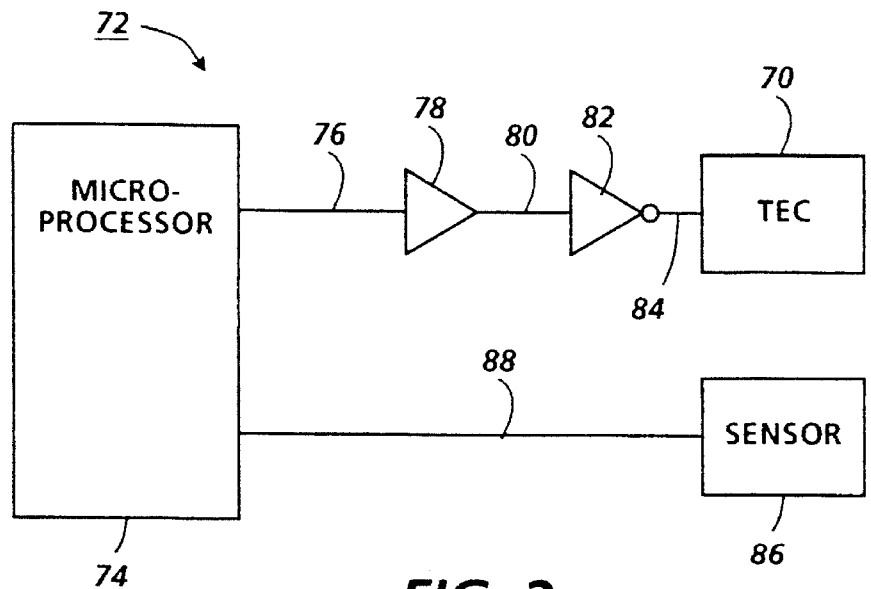
FIG. 2 is a circuit diagram of a pulse width modulation electronic circuit to monitor and correct for problems of laser drift.

An alternative embodiment, shown in FIG. 2, uses a pulse width modulated electronic circuit. A thermoelectric cooler 70 is used to stabilize the temperature of a laser diode (not shown). To more accurately stabilize the temperature, the thermoelectric cooler 70, a stabilizing circuit 72 is used.

In stabilizing circuit 72, a microprocessor 74 outputs a driving pulse width voltage on line 76. The driving voltage is received by buffer 78 and passed along line 80 to a switch 82. The driving voltage is then passed along line 84 to the thermo electric cooler 70. The stabilizing circuit 72 also includes a feedback path comprising a sensor 86 connected to the microproccessor 74 through line 88.

The forward time constant provided by the capacitor 46 and resistors 40, 48 in thermoelectric cooler circuit 32 and the feedback time constant provided by the capacitor 46 and resistors 40, 56 in thermoelectric circuit 32 is provided within the microprocessor 73 in the pulse width modulation circuit shown in FIG. 2.

When the target value is passed to a thermoelectric cooler circuit 32 on line 30 it first encounters resistor 48. Resistor 48 is connected to the convertor 28 on one end and the parallel configuration of the operational amplifier 34 with resistor 40 and capacitor 46. Also connected to the same end as the operational amplifier 34, resistor 40, and capacitor 46 is resistor 56. Resistors 48, 40 along with capacitor 46 form an RC circuit with an RC time constant which provides a delay to compensate for the reaction time of thermoelectric cooler 20 and stabilizes the feedback portion of the thermoelectric cooler circuit. Operation amplifier 34 generates a time delayed signal which is then passed along line 62 to resistor 50. This function would be performed within the microprocessor 72 in the pulse width modulation circuit shown in FIG. 2.

Resistor 50 is connected between the parallel configuration of operational amplifier 34 with capacitor 46 and resistor 40 and the parallel configuration of operational amplifier 36 with resistor 42. Resistor 42 and resistor 50 work in concert with operational amplifier 36 for gain control. The operational amplifier 36 is then used to drive the thermoelectric cooler 20. Resistor 54 is inserted between the output of the operational amplifier 36 and the input of thermoelectric cooler 20 and is used as a current limiting resistor to avoid overdriving the thermoelectric cooler 20. This function would be performed by the switch 82 in the pulse width modulation circuit shown in FIG. 2.

The thermoelectric cooler circuit 32 also contains a feedback circuit 64 connected to a thermoelectric cooler sensor 66. The thermoelectric cooler sensor 66 senses the temperature of the thermoelectric cooler. Alternatively the thermoelectric cooler sensor 66 could sense the temperature of the laser, or could be replaced with optical sensor to sense the power output of the laser. Alternatively, the thermoelectric cooler sensor 66 could sense the temperature of the laser, or could be replaced with an optical sensor to sense the power output of the laser.

The thermoelectric cooler sensor 66 in FIG. 1 then passes the sensed information to the resistor 52 and the microprocessor 24 on line 68. The resistor 52 functions along with resistors 44, 56, 48, and 40 to form an RC time constant with capacitor 46 for the operational amplifier 38. Operational amplifier 38 and its RC time constant provide the feedback circuit 64 for the stabilizing circuit 22.

The sensed information on line 68 is also sent to the microprocessor 24. This information is useful to microprocessor 24 as it controls the ramp up voltage or target voltage outputted by the microprocessor 24 on the 8-bit bus 26. When the unit is first turn on, the microprocessor 24 will ouput a target voltage higher which represents a temperature greater than the actual target voltage temperature. This higher voltage will drive the thermoelectric cooler 20 harder causing it to change its temperature faster than if the actual target voltage temperature were used. As the thermoelectric cooler 20 approaches the actual target voltage temperature the microprocessor 24 will output a lower target voltage which represents a temperature closer to the actual target voltage temperature. This will continue until the microprocessor 24 outputs the actual target voltage temperature and the thermoelectric cooler circuit 32 has stabilized.

In the pulsewidth modulation circuit shown in FIG. 2, the sensor 86 passes the sensed information directly to the microprocessor 74. The function of the RC time constant is then performed within the microprocessor 74 according to a set of training rules contained within the microprocessor 74.

Figure 3:
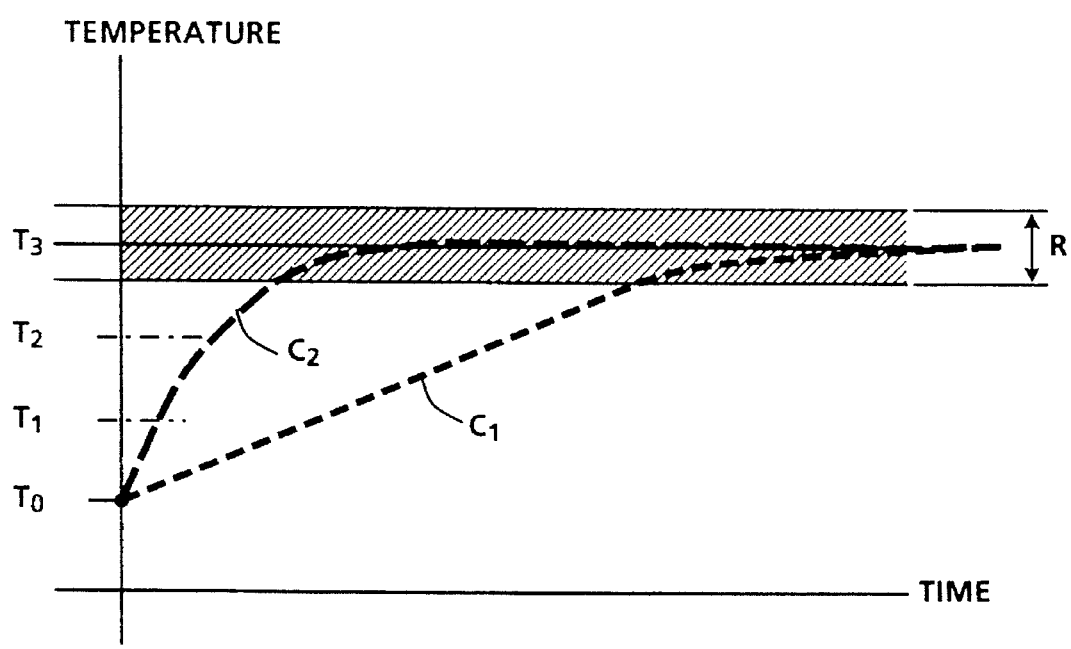
FIG. 3 is a temperature curve showing rising temperature of a thermoelectric cooler.
Figure 4:
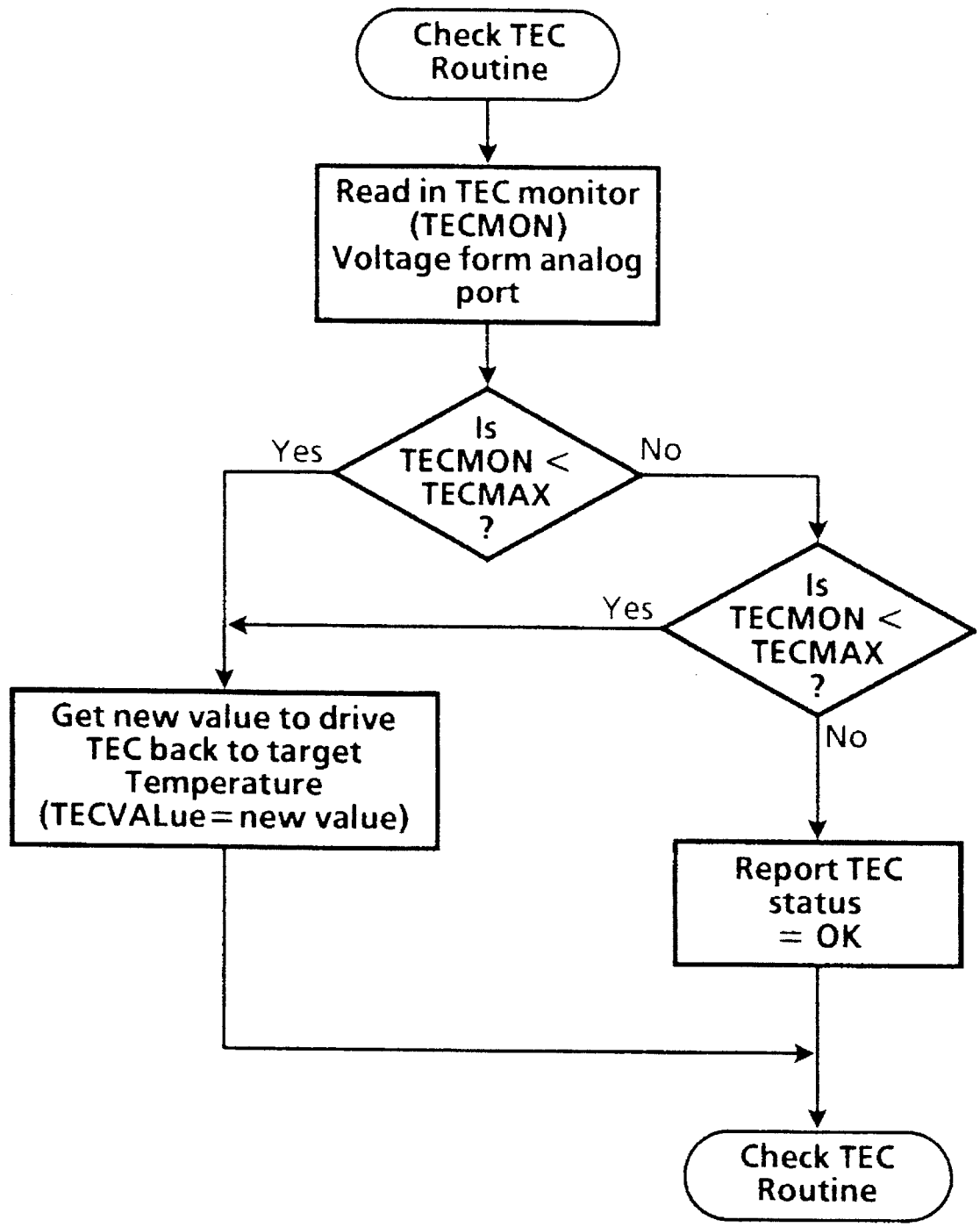
FIG. 4 is a flow chart showing a program in a microprocessor in the electronic circuit shown in FIG. 1.

This effect of the stabilizing circuit, whether it is the linear servo controlled electronic circuit shown in FIG. 1 or the pulse width modulated circuit shown in FIG. 2, is illustrated in FIG. 3. FIG. 3 is a graph of the temperature of the thermoelectric cooler 20 over time with temperature represented along the vertical axis and time along the horizontal axis. A target temperature value T3 surrounded by a range R is shown. The target temperature value T3 is the desired temperature for the thermoelectric cooler 20. If the microprocessor 24 or 74 were to ouput a voltage value representative of target value T3, the thermoelectric cooler circuit 32 or 72 would drive the thermoelectric cooler 20 or 70 to that target temperature value T3 along a curve C1. If however, the microprocessor 24 or 74 outputs a driving voltage which represents a temperature that is much higher than the target temperature value T3 on the 8-bit bus 26 it can cause the thermoelectric cooler circuit 32 or 72 to climb at a much faster rate as shown by the portion of another curve C2, as it appears between an initial temperature value T0 and temperature value T1. If the thermoelectric cooler 20 or 70 were allowed to stabilize at this driving voltage then it would overshoot the target temperature T3.

Once the thermoelectric cooler 20 or 70 has reached temperature value T1, that temperature will be sensed by the thermoelectric cooler sensor 66 or 86 respectively and feed back to the microprocessor 24 or 74 respectively. The microprocessor 24 or 74 respectively will then output a new value. The new value will still be greater than the voltage that represents target temperature value T3 but less than the inital value. The temperature of the thermoelectric cooler 20 or 70 will change at a slightly slower rate as represented by the portion of curve C2 between temperature value T1 and temperature value T2 but still at a faster rate than it would have if a voltage that represented the target temperature value T3 were used. If the thermoelectric cooler 20 or 70 were allowed to stabilize at this driving voltage then it would overshoot the target temperature T3 although by less than the initial driving voltage.

When the thermoelectric cooler 20 or 70 reaches a termperature value T2 that temperature will again be sensed by the thermoelectric cooler sensor 66 or 86 respectively and the temperature information will be sent back to the microprocessor 24 or 74 respectively. When the microprocessor 24 or 74 respectively has received this information it will again change the value output. This time the microprocessor 24 or 74 will output a value representative of the target temperature value T3. The temperature of the thermoelectric cooler will change at a slower rate and finally stabilize at the target temperature value T3 as shown on the portion of the curve C2 between temperature valueT2 and target temperature value T3.

As long as the temperature of the thermoelectric cooler 20 or 70 as sensed by the thermoelectric cooler sensor 66 or 86 respectively remains within range R the system is stabilized and the microprocessor 24 or 74 respectively will not change the value output. However, should the temperature of the thermoelectric cooler 20 or 70 change, the thermoelectric cooler sensor 66 or 86 respectively will sense the changed termperature and tell the microprocesser 24 or 74 respectively. The microprocessor 24 or 74 must then respond to correct the problem. The microprocessor 24 or 74 will output a new value that either represents a warming voltage or a cooling voltage depending on whether the thermoelectric cooler 20 or 70 is below or above the target temperature. The magnitude of the output voltage will depend on how far outside the range R the temperature of the thermoelectric cooler 20 or 70 has drifted. If the temperature of the thermoelectric cooler 20 or 70 is close to the target temperature value then only a small change is necessary. However, if the temperature of the thermoelectric cooler 20 or 70 has drifted into the temperature range represented between temperature value T1 and temperature value T2 for instance, then the microprocessor 24 or 74 must again pick a large enough value to quickly drive the thermoelectric cooler 20 or 70 towards the target temperature value T3. Then as the temperature of the thermoelectric cooler 20 or 70 approaches the target temperature value T3, the microprocessor 24 or 74 respectively will ouput a voltage more representative of the target temperature value T3. In all cases, whether the stabilizing circuit 22 or 72 has been turned on for the first time or is adjusting to changes in the thermoelectric cooler 20 or 70 respectively, the ouput value from the microprocessor 24 or 74 respectively will always be dependent on how large the difference is between the temperature of the thermoelectric cooler 20 or 70 respectively and the target temperature value T3. In this example, the microprocessor 24 or 74 utilizes a look up table contained in memory to choose an appropriate output value, however, the microprocessor 24 or 74 respectively could have used an appropriate algorithm and calculated a new appropriate output value. It should be noted that this example uses only three discrete ranges of temperatures where the microprocessor 24 or 74 evaluates and chooses an output value. However, this was done for explanatory purposes only and any number of ranges or a continuous function could have been used in actuality.

The software with the microprocessor for monitoring and correcting temperature deviations is represented by the flow chart in FIG. 3. So long as the voltage received from the thermoelectric cooler sensor 66 is neither less than a specified minimum voltage nor greater than a specified maximum voltage the status of the thermoelectric cooler 20 is reported as fine and the microprocessor does nothing. However, when the voltage received from the thermoelectric cooler sensor 66 deviates from the specified range, the microprocessor retrieves a new output value.

We claim:

1. A process for maintaining a desired temperature of a laser comprising:

a) a laser, b) a thermoelectric cooler responsive to a driving signal and operatively connected to said laser for maintaining a desired temperature of said laser, c) a temperature sensor being so constructed and arranged to sense a current thermoelectric cooler temperature and output a current temperature signal, d) means for storing at least two temperature range values and at least two temperature target value signals where each temperature range value has an associated temperature target value signal, one of the at least two temperature range values is a desired temperature range value, the desired temperature range value's associated temperature target value signal is a desired temperature target value signal which represents the desired temperature of said laser, the other temperature range values are non-desired temperature range values and the non-desired temperature range values' associated temperature target value signals are non-desired temperature target value signals which represent temperatures overshooting the desired temperature of said laser, e) sensing the current thermoelectric cooler temperature with said temperature sensor and outputting the current temperature signal, f) comparing the current temperature signal to the at least two temperature range values and determining within which temperature range the current temperature signal falls, g) retrieving the target value signal associated with the determined temperature range value, h) converting the retrieved target value signal into the driving signal, i) transmitting the driving signal to said thermoelectric cooler for operating said thermoelectric cooler, and k) repeating the process steps of e through i, if the determined temperature range value does not equal the desired temperature range value, until the determined temperature range value equals the desired temperature range value so that while the determined temperature range value does not equal the desired temperature range value the thermoelectric cooler is operated by a driving signal that is converted from a non-desired temperature target value signal to shorten the time for the thermoelectric cooler to reach the desired temperature range value by using a temperature target value signal which overshoots the desired temperature of the laser in comparison with using a temperature target signal which represents the desired temperature of the laser.

2. The process for maintaining a desired temperature of a laser of claim 1 wherein the non-desired temperature range values represent temperature ranges lower than the desired temperature range value and the non-desired temperature target value signals represent temperatures higher than the desired temperature target value signal.

3. The process for maintaining a desired temperature of a laser of claim 1 wherein the non-desired temperature range values represent temperature ranges higher than the desired temperature range value and the non-desired temperature target value signals represent temperatures lower than the desired temperature target value signal.

4. The process for maintaining a desired temperature of a laser of claim 2 wherein: there are at least two non-desired temperature range values, at least two non-desired temperature target values and the highest non-desired temperature target value signal is associated with the lowest non-desired temperature range value.

5. The process for maintaining a desired temperature of a laser of claim 3 wherein: there are at least two non-desired temperature range values, at least two non-desired temperature target values and the lowest non-desired temperature target value signal is associated with the highest non-desired temperature range value.

6. The process for maintaining a desired temperature of a laser of claim 2 wherein: there are at least three temperature range values, at least three temperature target values, and the temperature target value signals decrease as their respective temperature range values increase.

7. The process for maintaining a desired temperature of a laser of claim 3 wherein: there are at least three temperature range values, at least three temperature target values, and the temperature target value signals increase as their respective temperature range values decrease.

8. The process for maintaining a desired temperature of a laser of claim 1 wherein:

a) there are at least two non-desired temperature range values, b) there are at least two non-desired temperature target values, c) one of the at least two non-desired temperature range values represents a temperature range higher than the desired temperature range value and its associated non-desired temperature target value signal represents a temperature lower than the desired temperature target value signal, and d) another of the at least two non-desired temperature range values represents a temperature range lower than the desired temperature range value and its associated non-desired temperature target value signal represents a temperature higher than the desired temperature target value signal.

* * * * *